United States Patent
Chen et al.

(10) Patent No.: US 9,518,323 B2
(45) Date of Patent: Dec. 13, 2016

(54) METHODS, EQUIPMENT AND SYSTEMS FOR MEASURING RADIO FREQUENCY CROSSTALK

(71) Applicants: XIAMEN TIANMA MICRO-ELECTRONICS CO., LTD., Xiamen (CN); TIANMA MICRO-ELECTRONICS CO., LTD., Shenzhen (CN)

(72) Inventors: Weiji Chen, Xiamen (CN); Mingguang Cai, Xiamen (CN); Lei Wang, Xiamen (CN)

(73) Assignees: XIAMEN TIANMA MICRO-ELECTRONICS CO., LTD., Xiamen (CN); TIANMA MICRO-ELECTRONICS CO., LTD., Shenzhen (CN)

( * ) Notice: Subject to any disclaimer, the term of this patent is extended or adjusted under 35 U.S.C. 154(b) by 176 days.

(21) Appl. No.: 14/277,011

(22) Filed: May 13, 2014

(65) Prior Publication Data
US 2015/0002164 A1    Jan. 1, 2015

(30) Foreign Application Priority Data
Jun. 28, 2013 (CN) .......................... 2013 1 0270188

(51) Int. Cl.
*C23C 16/509* (2006.01)
*G01R 31/00* (2006.01)
*G01R 29/08* (2006.01)

(52) U.S. Cl.
CPC ......... *C23C 16/509* (2013.01); *G01R 29/0871* (2013.01)

(58) Field of Classification Search
CPC .... C23C 16/509; G01R 29/0871; G01R 31/00
(Continued)

(56) References Cited

U.S. PATENT DOCUMENTS

| 5,474,648 A * | 12/1995 | Patrick | H01J 37/32082 156/345.28 |
| 2003/0052085 A1 * | 3/2003 | Parsons | H01J 37/32082 216/60 |

(Continued)

FOREIGN PATENT DOCUMENTS

CN         202595271 U      12/2012

*Primary Examiner* — Son Le
*Assistant Examiner* — Akm Zakaria
(74) *Attorney, Agent, or Firm* — Kilpatrick Townsend & Stockton LLP

(57) ABSTRACT

Method, equipment and systems for measuring a radio frequency crosstalk are disclosed. The method includes: adjusting an impedance value of a matching network associated with a radio frequency electrode (including an anode and a cathode) in a plasma enhanced chemical vapor deposition (PECVD) system, and/or adjusting an impedance value of a radio frequency energy generating equipment associated with the radio frequency electrode, so that the sum of the impedance value of the matching network and the impedance value of the radio frequency electrode is the same as the impedance value of the radio frequency energy generating equipment; measuring an electrical signal received by the radio frequency electrode by the reversibility of energy transfer between the radio frequency electrode and the radio frequency energy generating equipment; and determining the energy of radio frequency crosstalk that the radio frequency electrode is subjected to according to the measured electrical signal.

15 Claims, 10 Drawing Sheets

---

101 — Adjusting an impedance value of a matching network corresponding to a radio frequency electrode in a PECVD system, and/or adjusting an impedance value of a radio frequency energy generating equipment corresponding to the radio frequency electrode, so that the sum of the impedance value of the matching network and the impedance value of the radio frequency electrode (including a cathode and an anode) is the same as the impedance value of the radio frequency energy generating equipment 102 — Measuring an electrical signal received by the radio frequency electrode 103 — Determining the energy of radio frequency crosstalk that the radio frequency electrode is subjected to according to the measured electrical signal

(58) Field of Classification Search
USPC .......................................................... 324/537
See application file for complete search history.

(56) References Cited

U.S. PATENT DOCUMENTS

| | | | |
|---|---|---|---|
| 2008/0174324 A1* | 7/2008 | Yamazawa | G01R 27/2641 324/707 |
| 2011/0140607 A1* | 6/2011 | Moore | A61B 18/042 315/111.21 |
| 2012/0000888 A1* | 1/2012 | Kawasaki | H01J 37/32082 216/67 |
| 2014/0177483 A1* | 6/2014 | Jones | H04L 5/14 370/278 |

* cited by examiner

"--Prior Art--"

"--Prior Art--"

METHODS, EQUIPMENT AND SYSTEMS FOR MEASURING RADIO FREQUENCY CROSSTALK

CROSS-REFERENCES TO RELATED APPLICATIONS

This application claims priority to Chinese Patent Application No. 201310270188.7, entitled "METHODS, EQUIPMENT AND SYSTEMS FOR MEASURING RADIO FREQUENCY CROSSTALK", filed with the State Intellectual Property Office of People's Republic of China on Jun. 28, 2013, which is incorporated by reference herein in its entirety for all purposes.

BACKGROUND OF THE INVENTION

The Plasma Enhanced Chemical Vapor Deposition (PECVD) process refers to a method of ionizing a gas containing atoms of a film component, into plasma by microwave or radio frequency or the like and depositing the desired film on a substrate by reaction by virtue of the characteristic of strong chemical activity of the plasma. In order to improve the manufacturing capacity of the PECVD process, the method for continuously disposing films in batch by PECVD has become a development trend.

FIG. 1(a) shows a schematic structural diagram of a conventional PECVD system for disposing films in batch. It can be seen from FIG. 1(a) that a plurality of radio frequency electrodes (each including an anode and a cathode) are arranged in an independent chamber, and each charged electrode (cathode) is connected to an independent radio frequency power supply and an impedance matching network to form an independent radio frequency discharge system. FIG. 1(b) is a schematic structural diagram of a common PECVD system for a multi-chamber film process. It can be seen from FIG. 1(b) that the PECVD system for dispose in batch includes one transfer chamber and a plurality of coating chambers, wherein the plurality of coating chambers correspond to one transfer chamber. Each coating chamber corresponds to one independent radio frequency discharge system, wherein one independent radio frequency discharge system includes a radio frequency generator, an impedance matching network and a radio frequency electrode. FIG. 2 shows a schematic structural diagram of the radio frequency system in the PECVD system.

Specifically, the operating principle that the PECVD system disposes films in batch is:

firstly, emptying the gas in each coating chamber to reach a vacuum state;

secondly, introducing a process gas into each coating chamber by a gas feed port of each coating chamber, wherein the amount of the introduced process gas is quantitatively controlled by an MFC (Mass Flow Controller); and thirdly, when the gas is introduced into each coating chamber, because the radio frequency generator in the radio frequency discharge system of the coating chamber generates radio frequency energy and the radio frequency energy is transmitted by a matcher to an electrode plate for generating plasma, forming a stable solid film by chemical reaction and deposition of the introduced gas on the surface of a solid.

The conventional process described above are often inadequate for various applications, as explained in more details below. It is desirable to have new and improved systems and methods for operating PECVD systems.

DETAILED DESCRIPTION OF THE INVENTION

The present invention relates to the field of a plasma enhanced chemical vapor deposition (PECVD) film manufacturing process. Various embodiments of the present invention provide methods, equipment and systems for measuring radio frequency crosstalk.

As mentioned above, conventional PECVD systems and processes are inadequate. More specifically, PECVD systems and processes are often undermined by radio frequency crosstalk problems. For example, in the process of simultaneously performing the coating process by a plurality of radio frequency electrodes, due to gaps between the radio frequency electrodes and leakage of energy in a radio frequency transmission line connected with each radio frequency electrode in the radio frequency discharge system, radio frequency crosstalk is generated between the respective radio frequency electrodes, and the instability is further caused in discharge of the electrode plate, so that the coating effect of the coating process is relatively poor.

It is to be appreciated that embodiments of the present invention address the problem of radio frequency crosstalk. The severity degrees of the radio frequency crosstalk generated between the radio frequency electrodes are different, some radio frequency crosstalk is relatively severe, and some radio frequency crosstalk is gentle. However, in the prior art, the generated radio frequency crosstalk can not be quantitatively measured, so that the radio frequency electrodes are affected by the radio frequency crosstalk all the time to lead to low quality of a coated film.

Embodiments of the present invention provide methods, equipment and systems for measuring radio frequency crosstalk. The sum of an impedance value of a matching network and an impedance value of a radio frequency electrode is the same as the impedance value of radio frequency energy generating equipment by adjusting the impedance value of the matching network corresponding to the radio frequency electrode in a PECVD system and/or adjusting the impedance value of the radio frequency energy generating equipment corresponding to the radio frequency electrode, an electrical signal received by the radio frequency electrode is measured by using the reversibility of energy transfer between the radio frequency electrode and the radio frequency energy generating equipment, and the energy of the radio frequency crosstalk that the radio frequency electrode is subjected to is determined according to the measured electrical signal, so that the radio frequency crosstalk generated between the radio frequency electrodes in the PECVD system can be quantitatively measured and eliminated according to the measurement result, and the working efficiency of the radio frequency electrodes in the PECVD system is improved.

Each embodiment of the present invention is described in detail below in conjunction with the accompanying drawing of the description.

An Embodiment

Figure 1:
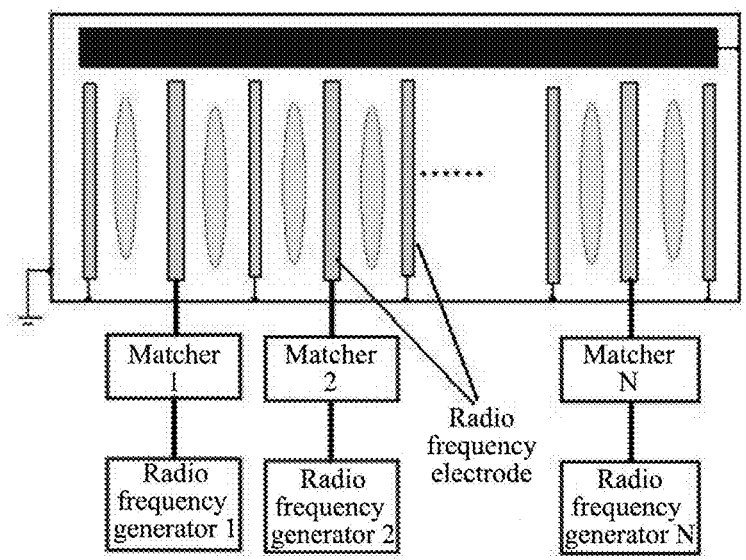
FIG. 1(a) is a schematic structural diagram of a common PECVD system for disposeing films in batch.
FIG. 1(b) is a schematic structural diagram of a common PECVD system for a multi-chamber film process.
Figure 1:
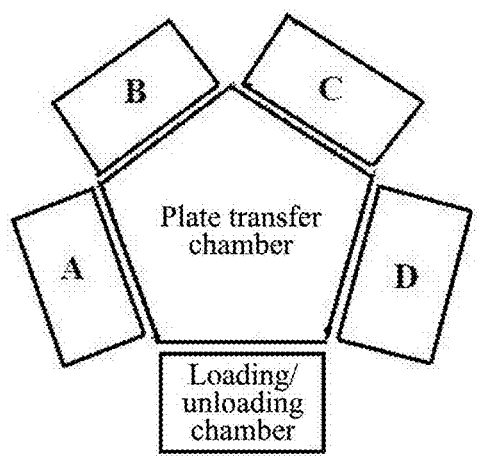
Figure 2:
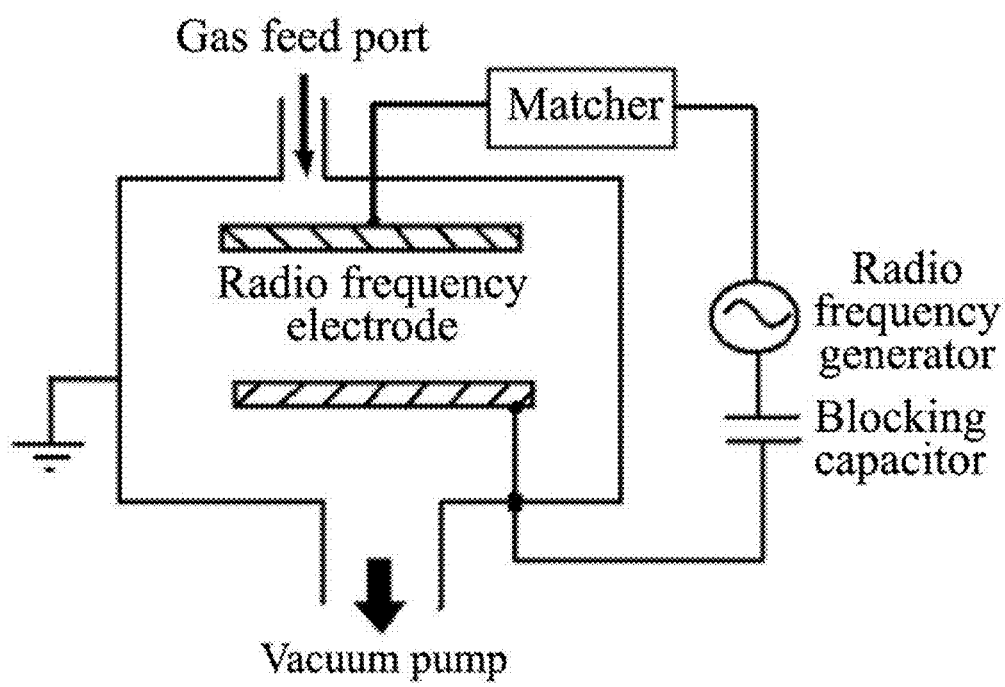
FIG. 2 is a schematic structural diagram of a radio frequency system of a PECVD system.
Figure 3:
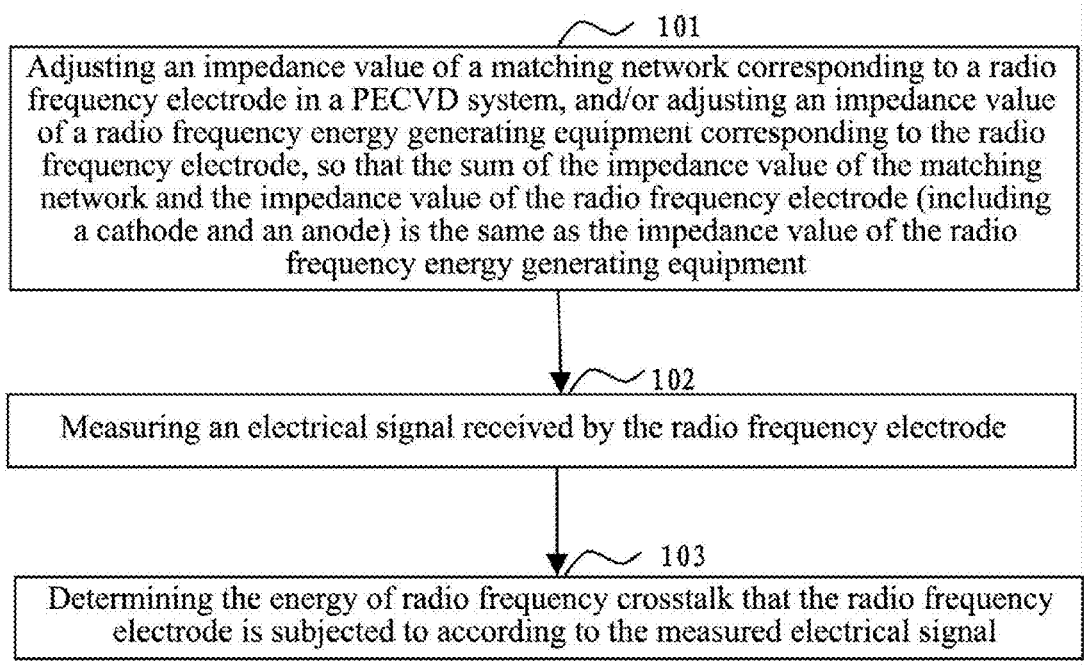
FIG. 3 is a schematic flow diagram of a method for measuring radio frequency crosstalk in an embodiment of the present invention.

FIG. 3 shows a schematic flow diagram of a method for measuring radio frequency crosstalk in an embodiment of the present invention. The method includes:

step 101: adjusting an impedance value of a matching network corresponding to radio frequency electrode in a PECVD system, and/or adjusting an impedance value of radio frequency energy generating equipment corresponding to the radio frequency electrode, so that the sum of the impedance value of the matching network and the impedance value of the radio frequency electrode is the same as the impedance value of the radio frequency energy generating equipment.

Specifically, in step 101, the ways that the sum of the impedance value of the matching network and the impedance value of the radio frequency electrode is the same as the impedance value of the radio frequency energy generating equipment include but not limited to:

I: singly adjusting the impedance value of the matching network corresponding to the radio frequency electrode in the PECVD system.

II: singly adjusting the impedance value of the radio frequency energy generating equipment corresponding to the radio frequency electrode.

III: adjusting the impedance value of the matching network corresponding to the radio frequency electrode in the PECVD system and the impedance value of the radio frequency energy generating equipment corresponding to the radio frequency electrode respectively.

IV: singly adjusting the frequency value of the output radio frequency of the radio frequency energy generating equipment corresponding to the radio frequency electrode.

Figure 4:
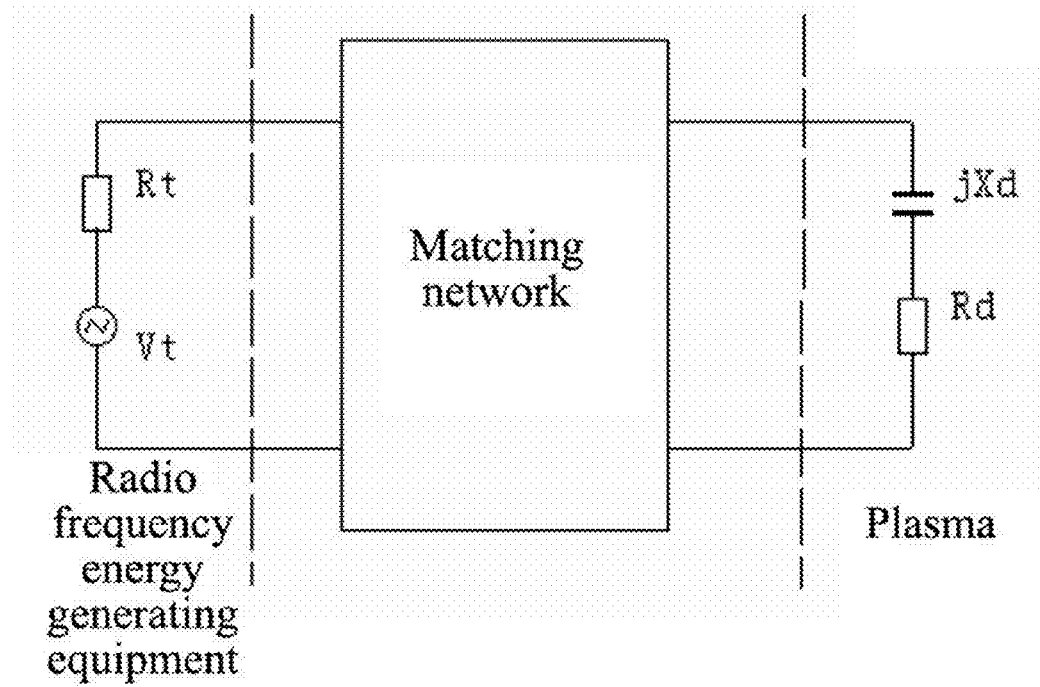
FIG. 4 is a schematic structural diagram of a radio frequency electrode, a matching network and radio frequency energy generating equipment in a PECVD radio frequency system.

FIG. 4 shows a schematic structural diagram of a radio frequency electrode, a matching network and radio frequency energy generating equipment in one radio frequency system in a PECVD.

When the radio frequency electrode works, the radio frequency energy generating equipment serving as a radio frequency source generates radio frequency energy with fixed or variable frequency, the generated radio frequency energy is fed into the radio frequency electrode through the matching network, the radio frequency electrode generates plasma, and at the moment, the impedance value of the generated plasma is $Z_{pla}$:

$Z_{pla}=R_d+jX_d$, wherein $R_d$ is the corresponding resistance value of the plasma, and $X_d$ is the corresponding reactance value of the plasma.

Because the source impedance of the radio frequency energy generating equipment is $Z_f$ and the impedance of the matching network is $Z_{mat}$, when the source impedance of the radio frequency energy generating equipment is equal to the sum of the impedance of the matching network and the impedance of the plasma, the power output by the radio frequency energy generating equipment is totally converted into the energy of the plasma, that is, when $Z_{rf}=Z_{mat}+Z_{pla}$, the power output by the radio frequency energy generating equipment is totally converted into the energy of the plasma.

It should be noted that the radio frequency electrode generates the plasma under the impact of the radio frequency energy, so the impedance of the plasma may be regarded as the impedance of the radio frequency electrode.

Figure 5A:
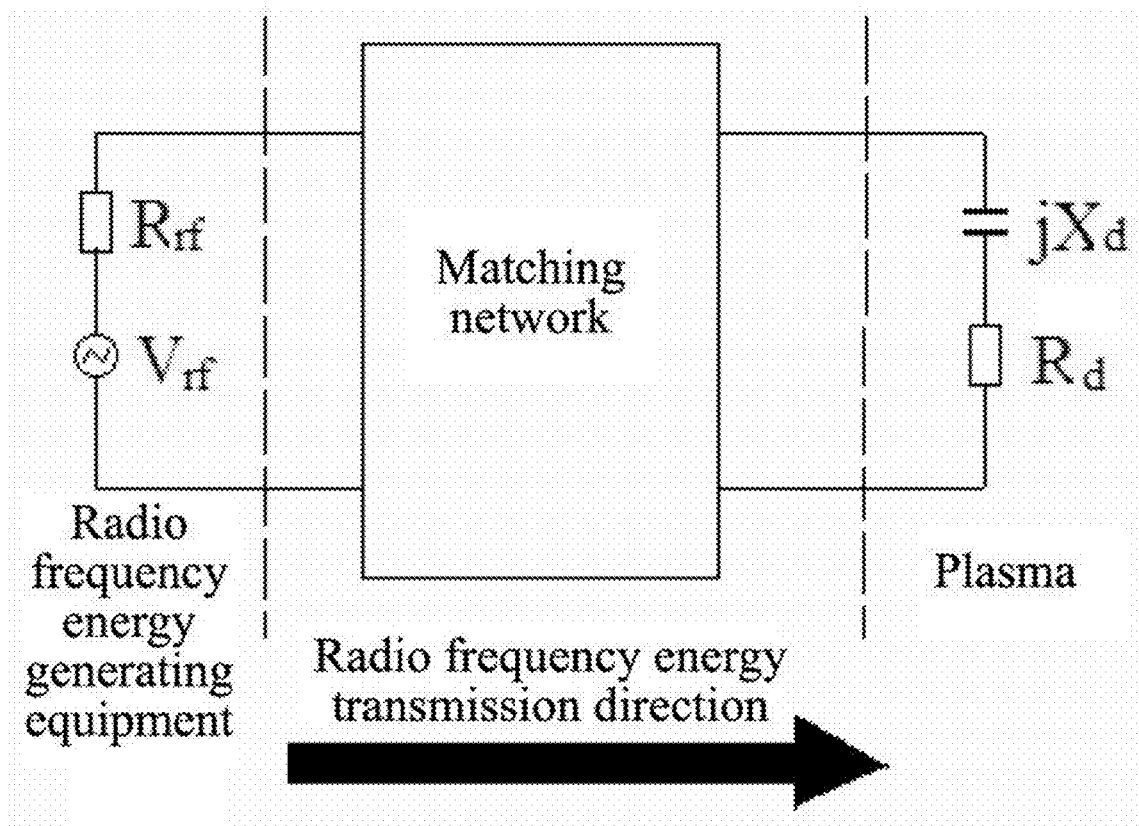
FIG. 5(a) is a schematic structural diagram of energy transmission among the radio frequency electrode, the matching network and the radio frequency energy generating equipment in the PECVD radio frequency system.

FIG. 5(a) shows a schematic structural diagram of energy transmission among the radio frequency electrode, the matching network and the radio frequency energy generating equipment in one PECVD radio frequency system.

It can be seen from FIG. 5(a) that in an ideal working state of the PECVD radio frequency system, that is, when the loop of the radio frequency energy satisfies $Z_{rf}=Z_{mat}+Z_{pla}$, the power output by the radio frequency energy generating equipment is transmitted to the radio frequency electrode through a coaxial cable and totally converted into the energy of the plasma.

Figure 5B:
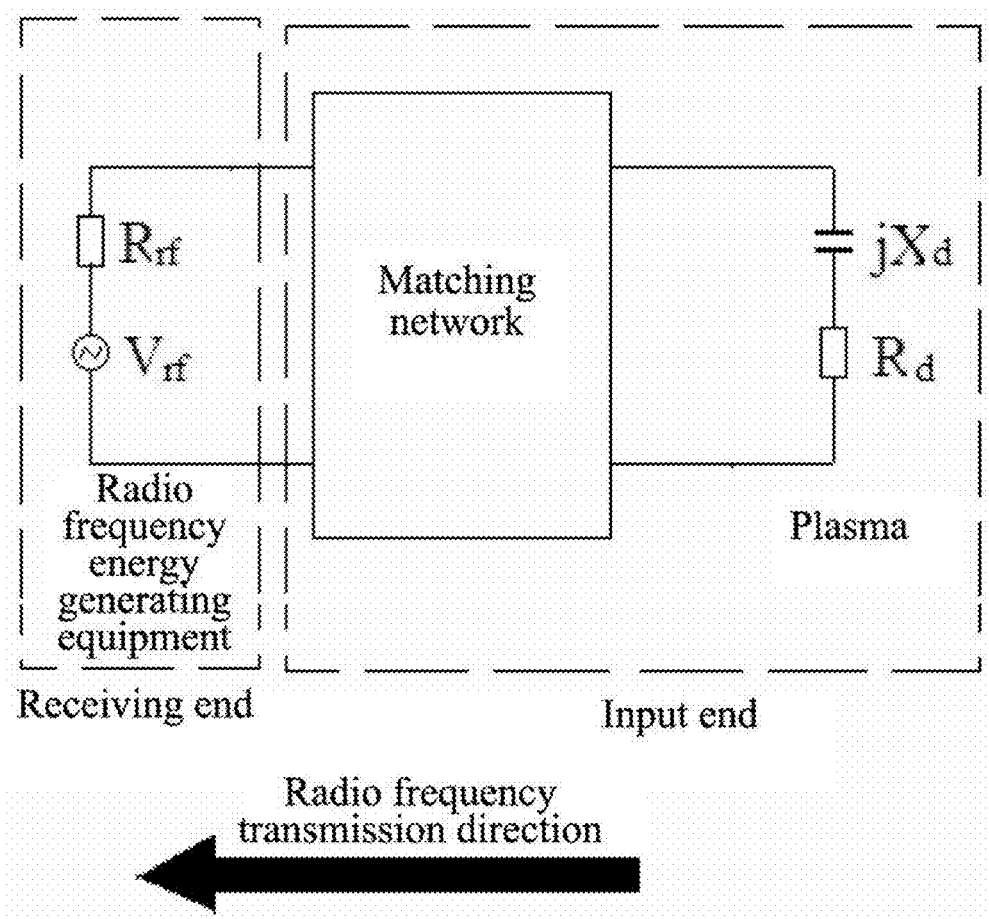
FIG. 5(b) is a schematic structural diagram of energy transmission among the radio frequency electrode, the matching network and the radio frequency energy generating equipment in the PECVD radio frequency system.

FIG. 5(b) shows a schematic structural diagram of energy transmission among the radio frequency electrode, the matching network and the radio frequency energy generating equipment in the PECVD radio frequency system.

It can be seen from FIG. 5(b) that in the ideal working state of the PECVD radio frequency system, the radio frequency electrode and the matching network are regarded as a whole used as an input end of the radio frequency energy, a radio frequency energy generating equipment is used as a receiving end of the radio frequency energy, and when the loop of the radio frequency energy satisfies $Z_{rf}=Z_{mat}+Z_{pla}$, the radio frequency energy output by the radio frequency electrode and the matching network is transmitted to the radio frequency generating energy equipment through a coaxial cable and totally absorbed by the radio frequency generating equipment.

It can be seen from the combination of FIG. 5(a) and FIG. 5(b) that when the impedance of the loop of the radio frequency energy satisfies $Z_{rf}=Z_{mat}+Z_{pla}$, the radio frequency energy transmission between the radio frequency electrode and the radio frequency energy generating equipment is reversible.

Accordingly, when the radio frequency crosstalk energy received by the radio frequency electrode is measured, a measurement environment needs to be met that the sum of the impedance value of the matching network and the impedance value of the radio frequency electrode is the same as the impedance value of the radio frequency energy generating equipment.

By adjusting the impedance value of the matching network corresponding to the radio frequency electrode in the PECVD system, the sum of the impedance value of the matching network and the impedance value of the radio frequency electrode is the same as the impedance value of the radio frequency energy generating equipment, including:

fixing the output frequency of the radio frequency energy generating equipment of the radio frequency electrode in the PECVD system, and adjusting the impedance value of the matching network corresponding to the radio frequency electrode in the PECVD system.

The step of adjusting the impedance value of the radio frequency energy generating equipment corresponding to the radio frequency electrode to enable the sum of the impedance value of the matching network and the impedance value of the radio frequency electrode to be the same as the impedance value of the radio frequency energy generating equipment includes:

fixing the impedance value of the matching network corresponding to the radio frequency electrode in the PECVD system, and adjusting the impedance value of the radio frequency energy generating equipment corresponding to the radio frequency electrode in the PECVD system.

The step of adjusting the impedance value of the radio frequency energy generating equipment corresponding to the radio frequency electrode to enable the sum of the impedance value of the matching network and the impedance value of the radio frequency electrode to be the same as the impedance value of the radio frequency energy generating equipment includes:

fixing the impedance value of the matching network corresponding to the radio frequency electrode in the PECVD system, and adjusting the output frequency of the radio frequency energy generating equipment corresponding to the radio frequency electrode in the PECVD system.

Specifically, the output frequency of the radio frequency energy generating equipment corresponding to the radio frequency electrode in the PECVD system is adjusted within a frequency range of 1 to 1,000 MHz.

Step 102: measuring an electrical signal received by the radio frequency electrode.

Specifically, in step 102, when the radio frequency electrode receives the radio frequency energy of the radio frequency energy generating equipment, certain radio frequency energy is reflected back at the transmission line and the radio frequency electrode, so when the electrical signal received by the radio frequency electrode is measured, transmission of radio frequency energy to the radio frequency electrode by the radio frequency energy generation equipment is suspended, wherein the electrical signal received by the radio frequency electrode includes one or more types of radio frequency energy radiated by other radio frequency electrodes in the PECVD system and received by the radio frequency electrode and radio frequency energy leaked in the radio frequency transmission line and received by the radio frequency electrode.

Preferably, the received electrical signal includes a current signal and/or a voltage signal.

Figure 6:
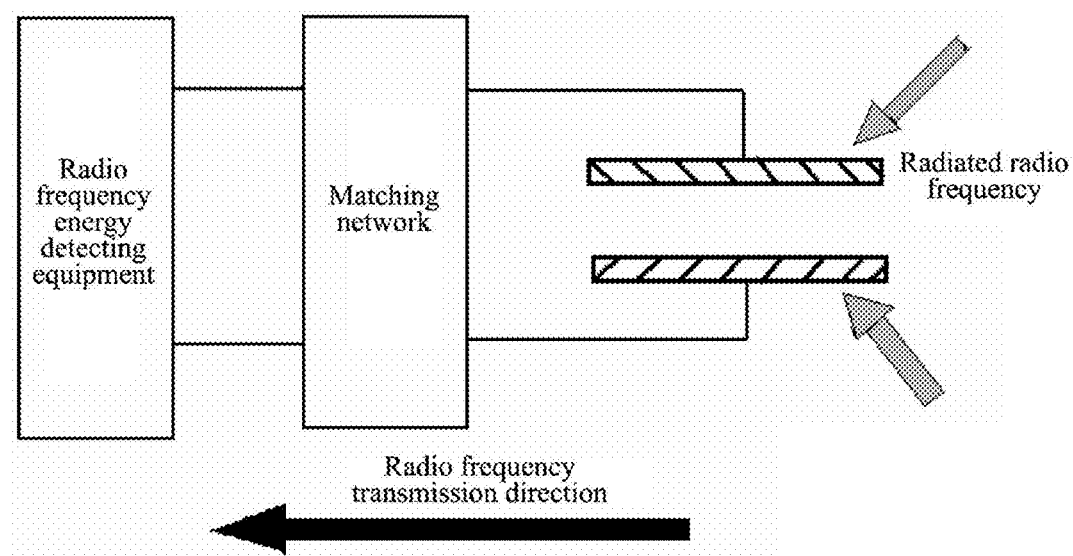
FIG. 6 is a schematic structural diagram of measuring the electrical signal received by the radio frequency electrode.

FIG. 6 shows a schematic structural diagram of measuring the electrical signal received by the radio frequency electrode.

Because emission and reception of electromagnetic waves are reversible, for example, a device (such as an antenna, a radio frequency electrode and the like) for emitting electromagnetic waves also has a function of receiving electromagnetic waves with the same frequency, so when transmission of radio frequency energy to the radio frequency electrode performed by the radio frequency energy generation equipment is suspended and the electromagnetic waves in other radio frequency electrodes except the radio frequency electrode and/or a radio frequency source nearby the radio frequency electrode leak energy, the radio frequency electrode serves as a function of reception of the radio frequency and receives the electrical signal capable of being received by itself.

The radio frequency energy received by the radio frequency electrode is transmitted to the radio frequency energy measuring equipment through the matching network shown in FIG. 6, so that measurement of the electrical signal capable of being received by the radio frequency electrode is realized.

It should be noted that the radio frequency energy measuring equipment includes but not limited to a voltammeter, an oscilloscope or other electronic devices capable of measuring the radio frequency energy, which are not limited herein.

Step 103: determining the energy of radio frequency crosstalk that the radio frequency electrode is subjected to according to the measured electrical signal.

Specifically, in step 103, a radio frequency energy value generated by the measured electrical signal is calculated according to the measured electrical signal, and the calculated radio frequency energy value is used as the energy of the radio frequency crosstalk that the radio frequency electrode is subjected to.

In the solution of an embodiment of the present invention, the sum of the impedance value of the matching network and the impedance value of the radio frequency electrode is the same as the impedance value of the radio frequency energy generating equipment by adjusting the impedance value of the matching network corresponding to the radio frequency electrode in the PECVD system and/or adjusting the impedance value of the radio frequency energy generating equipment corresponding to the radio frequency electrode, the electrical signal received by the radio frequency electrode is measured by using the reversibility of energy transfer between the radio frequency electrode and the radio frequency energy generating equipment, and the energy of the radio frequency crosstalk that the radio frequency electrode is subjected to is determined according to the measured electrical signal, so that the radio frequency crosstalk generated between the radio frequency electrodes in the PECVD system can be quantitatively measured and eliminated according to the measurement result, and the working efficiency of the radio frequency electrodes in the PECVD system is improved.

Another Embodiment

Figure 7:
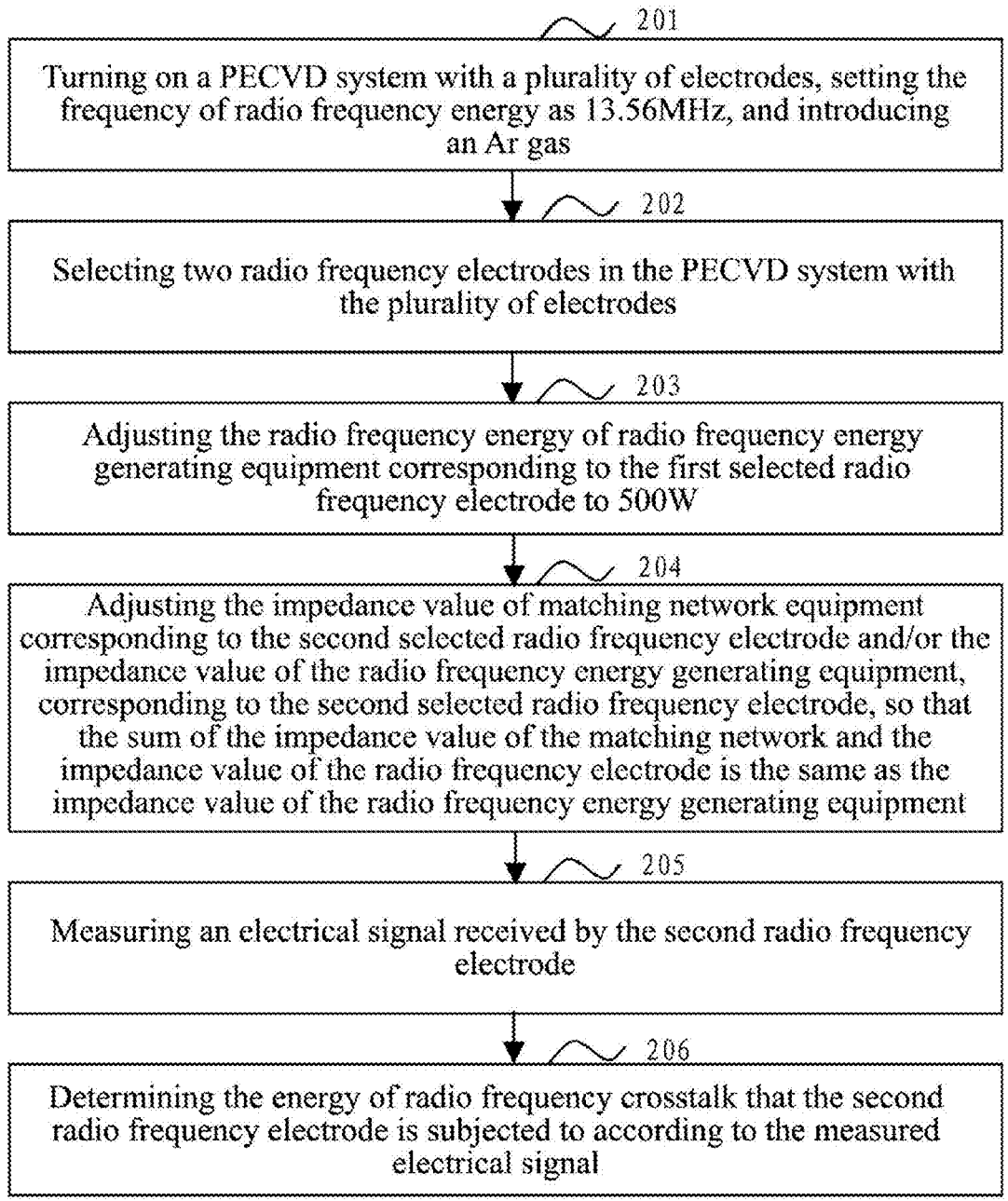
FIG. 7 is a schematic flow diagram of a method for measuring radio frequency crosstalk in another embodiment of the present invention.

FIG. 7 shows a schematic flow diagram of a method for measuring radio frequency crosstalk in another embodiment of the present invention. Another embodiment of the present invention is the detailed description of each step of the present invention, including:

step 201: turning on a PECVD system with a plurality of electrodes, setting the frequency of radio frequency energy as 13.56 MHz, and introducing an Ar gas;

step 202: selecting two radio frequency electrodes in the PECVD system with the plurality of electrodes;

step 203: adjusting the radio frequency energy of radio frequency energy generating equipment corresponding to the first selected radio frequency electrode to 500 W;

step 204: adjusting the impedance value of matching network equipment corresponding to the second selected radio frequency electrode and/or the impedance value of the radio frequency energy generating equipment corresponding to the second selected radio frequency electrode, so that the sum of the impedance value of the matching network and the impedance value of the radio frequency electrode is the same as the impedance value of the radio frequency energy generating equipment;

step 205: measuring an electrical signal received by the second radio frequency electrode;

specifically, in step 205, the frequency of the radio frequency energy received by the second radio frequency electrode is determined as 13.56 MHz by a radio frequency measurement instrument;

step 206: determining the energy of radio frequency crosstalk that the second radio frequency electrode is subjected to according to the measured electrical signal.

Another Embodiment

Figure 8:
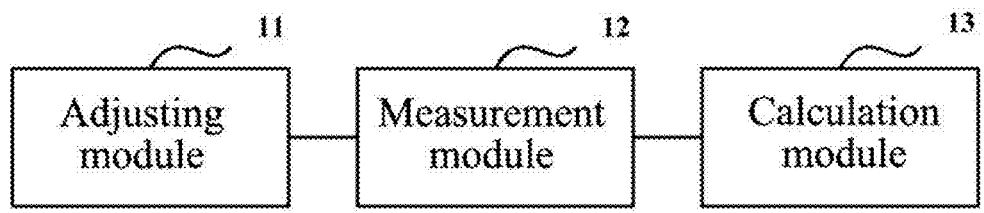
FIG. 8 is a schematic structural diagram of an equipment for measuring radio frequency crosstalk in another embodiment of the present invention.

FIG. 8 shows a schematic structural diagram of an equipment for measuring radio frequency crosstalk in another embodiment of the present invention. The equipment includes an adjusting module 11, a measurement module 12 and a calculation module 13, wherein the adjusting module 11 is configured for adjusting an impedance value of a matching network corresponding to a radio frequency electrode in a PECVD system or adjusting an impedance value of radio frequency energy generating equipment corresponding to the radio frequency electrode, so that the sum of the impedance value of the matching network and the impedance value of the radio frequency electrode is the same as the impedance value of the radio frequency energy generating equipment;

the measurement module 12 is configured for measuring an electrical signal received by the radio frequency electrode; and the calculation module 13 is configured for determining the energy of the radio frequency crosstalk that the radio frequency electrode is subjected to according to the measured electrical signal.

Specifically, the measurement module 12 is specifically configured for instructing the radio frequency energy generating equipment to suspend transmission of radio frequency energy to the radio frequency electrode and detect the electrical signal received by the radio frequency electrode;

wherein the electrical signal received by the radio frequency electrode includes one or more types of radio frequency energy radiated by other radio frequency electrodes in the PECVD system and received by the radio frequency electrode and radio frequency energy leaked in a radio frequency transmission line and received by the radio frequency electrode.

Specifically, the adjusting module 11 is configured for fixing the output frequency of the radio frequency energy generating equipment corresponding to the radio frequency electrode in the PECVD system and adjusting the impedance value of the matching network corresponding to the radio frequency electrode in the PECVD system.

Specifically, the adjusting module 11 is configured for fixing the impedance value of the matching network corresponding to the radio frequency electrode in the PECVD system and adjusting the impedance value of the radio frequency energy generating equipment corresponding to the radio frequency electrode in the PECVD system.

Specifically, the adjusting module 11 is configured for adjusting the output frequency of the radio frequency energy generating equipment corresponding to the radio frequency electrode in the PECVD system within a frequency range of 1 to 1,000 MHz.

Preferably, the received electrical signal includes a current signal and/or a voltage signal.

Specifically, the calculation module is configured for calculating a radio frequency energy value generated by the measured electrical signal according to the measured electrical signal, and the calculated radio frequency energy value is used as the energy of the radio frequency crosstalk that the radio frequency electrode is subjected to.

It should be noted that the equipment for measuring radio frequency crosstalk in the embodiment of the present invention may be a logic component realized by software or a physical entity unit realized by hardware, which is not limited herein.

Another Embodiment

Figure 9:
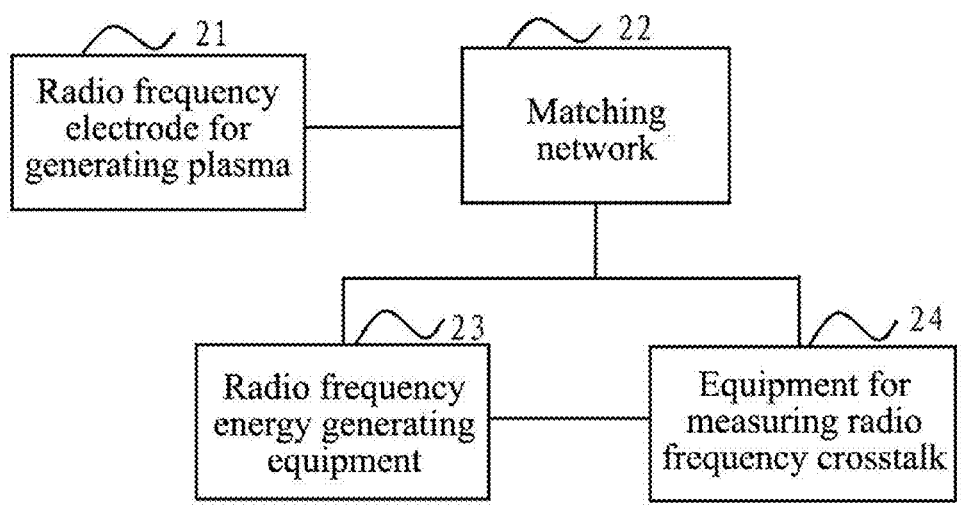
FIG. 9 is a schematic structural diagram of a system for measuring radio frequency crosstalk in another embodiment of the present invention.

FIG. 9 shows a schematic structural diagram of a system for measuring radio frequency crosstalk in another embodiment of the present invention. The system includes a radio frequency electrode 21 for generating plasma, a matching network 22, radio frequency energy generating equipment 23 and an equipment 24 for measuring radio frequency crosstalk, wherein equipment 24 for measuring the radio frequency crosstalk is configured for adjusting an impedance value of a matching network corresponding to the radio frequency electrode in a PECVD system or adjusting an impedance value of the radio frequency energy generating equipment corresponding to the radio frequency electrode so that the sum of the impedance value of the matching network and the impedance value of the radio frequency electrode is the same as the impedance value of the radio frequency energy generating equipment, measuring an electrical signal received by the radio frequency electrode, and determining the energy of radio frequency crosstalk that the radio frequency electrode is subjected to according to the measured electrical signal.

Specifically, the equipment 24 for measuring radio frequency crosstalk is configured for instructing the radio frequency energy generating equipment to suspend transmission of radio frequency energy to the radio frequency electrode and detect the electrical signal received by the radio frequency electrode;

wherein the electrical signal received by the radio frequency electrode includes one or more types of radio frequency energy radiated by other radio frequency electrode in the PECVD system and received by the radio frequency electrode and radio frequency energy leaked in a radio frequency transmission line and received by the radio frequency electrode.

Specifically, the equipment 24 for measuring radio frequency crosstalk is configured for fixing the output frequency of the radio frequency energy generating equipment corresponding to the radio frequency electrode in the PECVD system and adjusting the impedance value of the matching network corresponding to the radio frequency electrode in the PECVD system.

Specifically, the equipment 24 for measuring radio frequency crosstalk is configured for fixing the impedance value of the matching network corresponding to the radio frequency electrode in the PECVD system and adjusting the impedance value of the radio frequency energy generating equipment corresponding to the radio frequency electrode in the PECVD system.

Specifically, the equipment 24 for measuring radio frequency crosstalk is configured for adjusting the output frequency of the radio frequency energy generating equipment corresponding to the radio frequency electrode in the PECVD system within a frequency range of 1 to 1,000 MHz.

Preferably, the received electrical signal includes a current signal and/or a voltage signal.

Specifically, the equipment 24 for measuring radio frequency crosstalk is configured for calculating a radio frequency energy value generated by the measured electrical signal according to the measured electrical signal, and the calculated radio frequency energy value is used as the energy of the radio frequency crosstalk that the radio frequency electrode is subjected to.

It should be appreciated by those skilled in the art that the embodiments of the present invention may be provided as methods, devices (equipment) or computer program products. Therefore, the present invention may adopt the form of complete hardware embodiments, complete software embodiments or embodiments of software and hardware in combination. Moreover, the present invention may adopt the form of computer program products implemented on one or more computer-available storage media (including but not limited to a magnetic disk memory, a compact disc read-only memory (CD-ROM), an optimal memory and the like) including computer-available program codes.

The present invention has been described in a flow chart and/or a block diagram of the method, devices (equipment) and computer program products according to the embodiments of the present invention. It should be appreciated that each flow and/or block in the flow charts and/or block diagrams and combination of flows and/or blocks in the flow charts and/or block diagrams may be embodied in computer program instructions. These computer program instructions may be loaded onto a general-purpose computer, a specific-purpose computer, an embedded processor or a processor of another programmable data processing equipment to produce a machine so that the instructions executed on the computer or the processor of the another programmable data processing equipment create means for performing the functions specified in one or more flows of the flow diagrams and/or one or more blocks of the block diagrams.

These computer program instructions may also be stored into a computer-readable memory capable of directing the computer or other programmable data processing equipment to operate in a specific mode, so that the instructions stored in the computer readable memory create an article of manufacture including instruction means which perform the functions specified in one or more flows of the flow diagrams and/or one or more blocks of the block diagrams.

These computer program instructions may also be loaded onto the computer or other programmable data processing equipment, so that a series of operation steps are executed in the computer or other programmable data processing equipment to produce processing implemented by the computer, and the instructions executed on the computer or other programmable data processing equipment provide steps for performing the functions specified in one or more flows of the flow diagrams and/or one or more blocks of the block diagrams.

It is to be appreciated that embodiments of the present invention can be implemented in many ways. For example, certain embodiments of the present invention provide a method and an equipment for measuring radio frequency crosstalk are provided for provide quantitative measurement of radio frequency crosstalk, which contributes to low quality of coat films.

As an example, a method for measuring radio frequency crosstalk includes:

adjusting an impedance value of a matching network corresponding to a radio frequency electrode in a plasma enhanced chemical vapor deposition (PECVD) system, and/or adjusting an impedance value of a radio frequency energy generating equipment corresponding to the radio frequency electrode, so that a sum of the impedance value of the matching network and the impedance value of the radio frequency electrode is the same as the impedance value of the radio frequency energy generating equipment;

measuring an electrical signal received by the radio frequency electrode; and determining the energy of radio frequency crosstalk that the radio frequency electrode is subjected to according to the measured electrical signal.

In an example, equipment for measuring radio frequency crosstalk includes:

an adjusting module, configured for adjusting an impedance value of a matching network corresponding to a radio frequency electrode in a PECVD system, and/or adjusting an impedance value of radio frequency energy generating equipment corresponding to the radio frequency electrode, so that the sum of the impedance value of the matching network and the impedance value of the radio frequency electrode is the same as the impedance value of the radio frequency energy generating equipment;

a measurement module, configured for measuring an electrical signal received by the radio frequency electrode; and a calculation module, configured for determining the energy of the radio frequency crosstalk that the radio frequency electrode is subjected to according to the measured electrical signal.

For example, a system for measuring radio frequency crosstalk includes a radio frequency electrode for generating plasma in a PECVD system, a matching network, and a radio frequency energy generating equipment, and further includes the above-mentioned equipment for measuring the radio frequency crosstalk.

It is to be appreciated that embodiments of the present invention provides numerous advantages and benefits over existing techniques and systems. One of the benefits includes that the sum of the impedance value of the matching network and the impedance value of the radio frequency electrode is the same as the impedance value of the radio frequency energy generating equipment by adjusting the impedance value of the matching network of the radio frequency electrode in the PECVD system and/or adjusting the impedance value of the radio frequency energy generating equipment of the radio frequency electrode, the electrical signal received by the radio frequency electrode is measured by using the reversibility of energy transfer between the radio frequency electrode and the radio frequency energy generating equipment, and the energy of the radio frequency crosstalk that the radio frequency electrode is subjected to is determined according to the measured electrical signal, so that the radio frequency crosstalk generated between the radio frequency electrodes in the PECVD system can be quantitatively measured and eliminated according to the measurement result, and the working efficiency of the radio frequency electrodes in the PECVD system is improved. There are other benefits as well. Although the preferred embodiments of the present invention have been described, those skilled in the art benefiting from the underlying inventive concept can make additional modifications and variations to these embodiments. Accordingly, the appended claims are intended to be interpreted as encompassing the preferred embodiments and all the modifications and variations falling into the scope of the present invention.

Obviously, those skilled in the art can make various modifications and variations to the present invention without departing from the spirit and scope of the present invention. Thus, the present invention is also intended to encompass these modifications and variations thereto so long as the modifications and variations fall into the scope of the claims appended to the invention and their equivalents.

What is claimed is:

1. A method for measuring radio frequency crosstalk, comprising:
    adjusting an impedance value of a matching network associated with a radio frequency electrode in a plasma enhanced chemical vapor deposition (PECVD) system, and/or adjusting an impedance value of a radio frequency energy generating equipment associated with the radio frequency electrode, so that a sum of the impedance value of the matching network and a impedance value of the radio frequency electrode is substantially the same as the impedance value of the radio frequency energy generating equipment;
    suspending transmission of radio frequency energy from the radio frequency energy generation equipment to the radio frequency electrode, and detecting the electrical signal received by the radio frequency electrode during the suspending transmission of radio frequency energy from the radio frequency energy generation equipment to the radio frequency electrode; and
    determining an energy of a radio frequency crosstalk at least based on the electrical signal received.

2. The method according to claim 1, wherein the electrical signal received by the radio frequency electrode comprises one or more types of radio frequency energy radiated by other radio frequency electrodes in the PECVD system and received by the radio frequency electrode and radio frequency energy leaked in a radio frequency transmission line and received by the radio frequency electrode.

3. The method according to claim 1, wherein adjusting the impedance value of the matching network associated with the radio frequency electrode in the PECVD system comprises:
    fixing an output frequency of the radio frequency energy generating equipment associated with the radio frequency electrode in the PECVD system, and adjusting the impedance value of the matching network associated with the radio frequency electrode in the PECVD system.

4. The method according to claim 1, wherein adjusting the impedance value of the radio frequency energy generating equipment associated with the radio frequency electrode in the PECVD system comprises:
    fixing the impedance value of the matching network associated with the radio frequency electrode in the PECVD system, and adjusting the impedance value of the radio frequency energy generating equipment associated with the radio frequency electrode in the PECVD system.

5. The method according to claim 1, wherein adjusting the impedance value of the radio frequency energy generating equipment associated with the radio frequency electrode in the PECVD system comprises:
    fixing the impedance value of the matching network associated with the radio frequency electrode in the PECVD system, and adjusting an output frequency of the radio frequency energy generating equipment associated with the radio frequency electrode in the PECVD system.

6. The method according to claim 5, wherein adjusting the output frequency of the radio frequency energy generating equipment associated with the radio frequency electrode in the PECVD system comprises:
    adjusting the output frequency of the radio frequency energy generating equipment associated with the radio frequency electrode in the PECVD system within a frequency range of 1 to 1,000 MHz.

7. The method according to claim 1, wherein the received electrical signal comprises a current signal and/or a voltage signal.

8. The method according to claim 1, wherein the determining the energy of the radio frequency crosstalk that the radio frequency electrode is subjected to according to the measured electrical signal comprises:
    calculating a radio frequency energy value generated by the measured electrical signal according to the measured electrical signal, and taking the calculated radio frequency energy value as the energy of the radio frequency crosstalk that the radio frequency electrode is subjected to.

9. An equipment for determining radio frequency crosstalk, comprising:
    an adjusting module, configured for adjusting an impedance value of a matching network associated with a radio frequency electrode in a plasma enhanced chemical vapor deposition (PECVD) system or adjusting an impedance value of a radio frequency energy generating equipment associated with the radio frequency electrode, so that a sum of the impedance value of the matching network and a impedance value of the radio frequency electrode is substantially the same as the impedance value of the radio frequency energy generating equipment;
    a measurement module, configured for instructing the radio frequency energy generating equipment to suspend transmission of radio frequency energy to the radio frequency electrode and detecting the electrical signal received by the radio frequency electrode; and measuring an electrical signal received by the radio frequency electrode during radio frequency energy generating equipment suspending transmission of radio frequency energy to the radio frequency electrode; and
    a calculation module, configured for determining an energy of a radio frequency crosstalk based at least on the electrical signal received.

10. The equipment according to claim 9, wherein the electrical signal received by the radio frequency electrode comprises one or more types of radio frequency energy radiated by other radio frequency electrodes in the PECVD system and received by the radio frequency electrode and radio frequency energy leaked in a radio frequency transmission line and received by the radio frequency electrode.

11. The equipment according to claim 9, wherein the adjusting module is configured for fixing an output frequency of the radio frequency energy generating equipment associated with the radio frequency electrode in the PECVD system and adjusting the impedance value of the matching network associated with the radio frequency electrode in the PECVD system.

12. The equipment according to claim 9, wherein the adjusting module is configured for fixing the impedance value of the matching network associated with the radio frequency electrode in the PECVD system and adjusting an output frequency of the radio frequency energy generating equipment associated with the radio frequency electrode in the PECVD system.

13. The equipment according to claim 9, wherein the adjusting module is configured for fixing the impedance value of the matching network associated with the radio frequency electrode in the PECVD system and adjusting the impedance value of the radio frequency energy generating equipment associated with the radio frequency electrode in the PECVD system.

14. A method for determining interference in a PECVD system, the method comprising:
   measuring a first impedance value of an RF source and an second impedance value of an electrode;
   providing a matching module, the matching module being electrically coupled to the RF source and electrode, the matching module being characterized by a third impedance value, the third impedance value being adjustable;
   adjusting the third impedance value at least based on the first impedance value and the second impedance value;
   suspending transmission of radio frequency energy from the RF source to the electrode, and measuring an electrical signal received by the electrode during suspending transmission of radio frequency energy from the RF source to the electrode; and
   determining a crosstalk energy based on the electrical signal received.

15. The method claim 14 further comprising adjusting the first impedance value and/or the third impedance value to maximize a plasma energy level associated with the electrode.

* * * * *